United States Patent
Sams

(10) Patent No.: US 6,590,418 B1
(45) Date of Patent: Jul. 8, 2003

(54) METHOD AND APPARATUS FOR A PROGRAMMABLE OUTPUT INTERFACE

(75) Inventor: David T. Sams, Columbia, SC (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 10/021,057

(22) Filed: Dec. 19, 2001

(51) Int. Cl.[7] ............................................. H03K 19/177
(52) U.S. Cl. ............................ 326/39; 326/56; 326/58; 326/37; 710/56
(58) Field of Search ...................... 326/37–41, 56–58, 326/82, 105

(56) References Cited

U.S. PATENT DOCUMENTS

| | | | | |
|---|---|---|---|---|
| 4,933,577 A | * | 6/1990 | Wong et al. ................... | 326/40 |
| 4,987,319 A | * | 1/1991 | Kawana ......................... | 326/37 |
| 5,185,706 A | * | 2/1993 | Agrawal et al. ................ | 716/1 |
| 5,612,631 A | * | 3/1997 | Agrawal et al. ............... | 326/39 |
| 5,848,285 A | * | 12/1998 | Kapusta et al. ................ | 712/1 |
| 5,944,813 A | * | 8/1999 | Trimberger ................... | 712/36 |
| 6,239,613 B1 | * | 5/2001 | Reddy et al. .................. | 326/39 |

* cited by examiner

*Primary Examiner*—Michael Tokar
*Assistant Examiner*—Vibol Tan
(74) *Attorney, Agent, or Firm*—Antonelli, Terry, Stout & Kraus, LLP

(57) ABSTRACT

A method and apparatus for a programmable output interface which includes a switching device and an output driver. The switching device receives an enable signal, a selection signal, and an information signal. The switching device passes the enable signal or the information signal to an output of the switching device based on the selection signal. An output of the output driver is enabled by the output of the switching device. The output driver receives the information signal and passes the information to the output of the output driver if the output driver is enabled. The selection signal is usable to convert the output driver output to a tri-state output or an open collector output. The enable signal is usable to enable and disable the tri-state when the output driver output is a tri-state output.

18 Claims, 6 Drawing Sheets

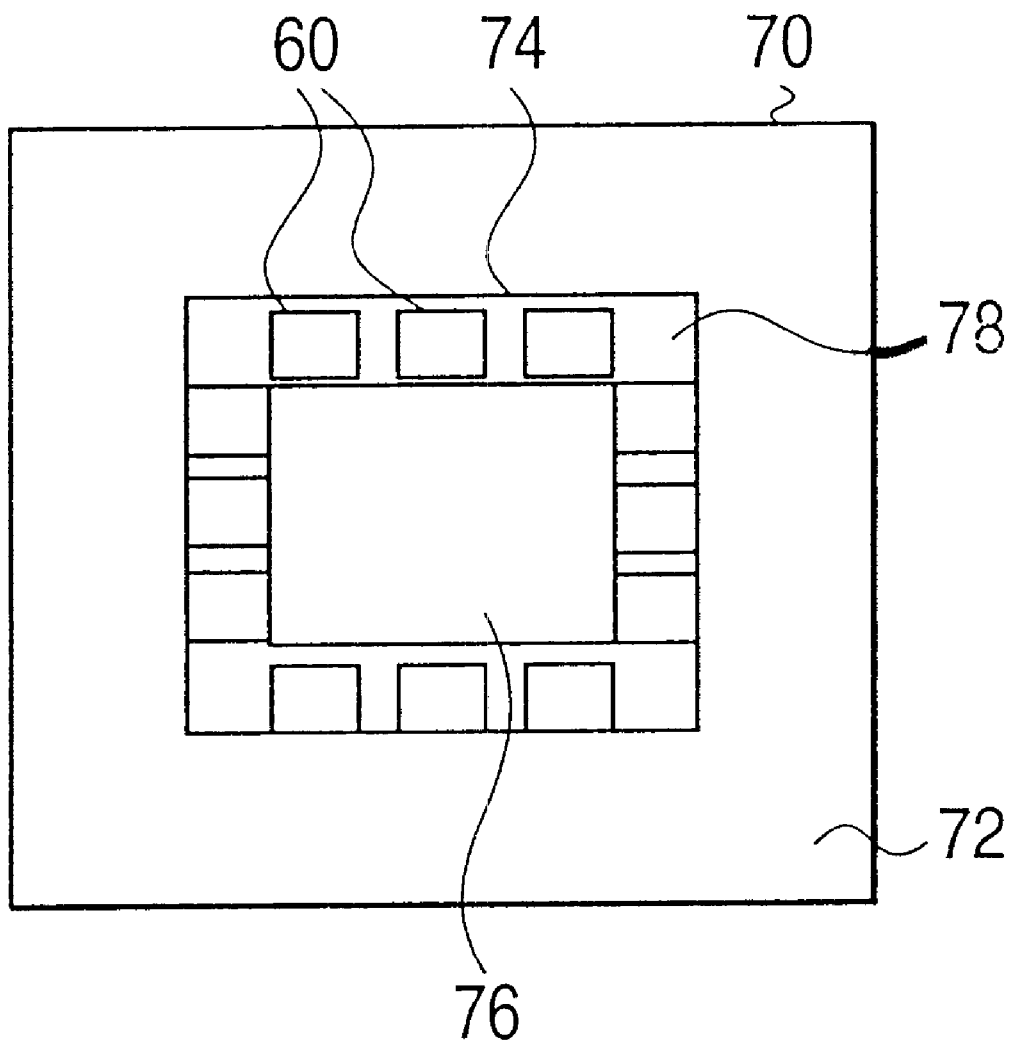

METHOD AND APPARATUS FOR A PROGRAMMABLE OUTPUT INTERFACE

BACKGROUND

1. Field of the Invention

This invention relates to output drivers, and more specifically to programming an output driver to have a tri-state output or an open collector output.

2. Background Information

In electronic systems and subsystems, there may be many devices and components that need to communicate with each other. Bus structures in these systems and subsystems allow communication between the various devices and components as well as with the outside world. The concept of a bus structure is to have a single set of lines, one for each bit, which runs to each subsystem and/or component, much like a party line employed by the telephone company. Control lines then select which component will be the transmitter of information and which will be the receiver. Most subsystems and components both transmit and receive information, but some only handle data in one direction. When subsystems and components are interconnected that transmit and receive information, one way to implement the communication path is to have a single signal line for transmitting information and another for receiving information. However, a single bus is capable of providing only one path, therefore, reducing signal lines and possibly overall space taken up by the system or subsystem.

To have a successful bus structure, there must be a convenient method for coupling sources to the bus. There must also be a good way to ensure that no more than one source tries to communicate on the bus at any one time. Two current ways of satisfying these conditions are the use of open collector logic (or open drain logic for Metal Oxide Semiconductor (MOS) technology), and tri-state logic.

FIGS. 1A and 1B show example open collector circuit configurations. In open collector gates, each gate is constructed with the collector of its final transistor, forming a direct output as shown in FIG. 1A. Several gates may then be arranged to form the common (wired logic) output as shown in FIG. 1B by connecting their collectors to a single external resistor-power supply combination. The operation of the composite logic circuit is that if all gates supply no more than 0 volts to each transistor's input resistor, each transistor will be off, resulting in the common output being "pulled-up" to the power supply voltage (e.g., +5 volts).

On the other hand, any input transistor receiving a voltage somewhat above zero volts (e.g., plus 5 v) will be turned on, causing it to act like a closed switch between the collector and emitter. Thus, one or more on transistors forces the common output to be effectively grounded. Open collector logic allows each source to be placed on the bus at any convenient location rather than at a central point. Moreover, more sources can be easily added without having to exchange the original "OR" gate for one permitting more inputs.

FIG. 2 shows a typical tri-state gate. As the name implies, tri-state gates have three possible outputs: logical '1', logical '0', and an open circuit condition. Note that when the control is in the logical '0' state, the output is effectively disconnected from the bus so that the input has no effect on the bus. When the control is in the '1' state, however, the output, and hence the bus, follow the gate input. With tri-state logic, a large number of sources may be properly connected to the bus.

In designing an electronic circuit or subsystem, many times it is known what type of interface the subsystem or component will be connected to, i.e., open collector or tri-state. However, in some cases, especially in cases where generic "off the shelf" components or subsystems are being designed, it is not known what type of bus structure or external connection the subsystem or circuit will be used in and/or connected to. In these cases, a designer may have to design two versions of a subsystem or component, one with a tri-state output and the other with an open collector output. This problem is more evident in the design of microcircuits or chips. In designing these devices, once the device is manufactured, no modifications or changes are possible. Therefore, to make the microcircuit usable to every application, two versions of the microcircuit may need to be designed. This is both time consuming and expensive.

Therefore, a need exists for method and apparatus for a programmable output interface that allows adaptation of a single subsystem or component device to be designed into several product offerings with only simple programming differences.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein:

FIG. 6 is a diagram of a microcircuit with a programmable output interface I/O pad according to an example embodiment of the present invention.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to method and apparatus for a programmable output interface where the output of a circuit is programmable to have either a tri-state output or an open collector output. This allows flexibility in that a single component device (or subsystem) may support various application interfaces that are required by external subsystems or devices. According to the present invention, a single component may be used in the design of several circuits and applications with only simple programming differences. Thus, the need for external glue logic for interconnecting the single component to the appropriate interface is eliminated.

Figure 1A:
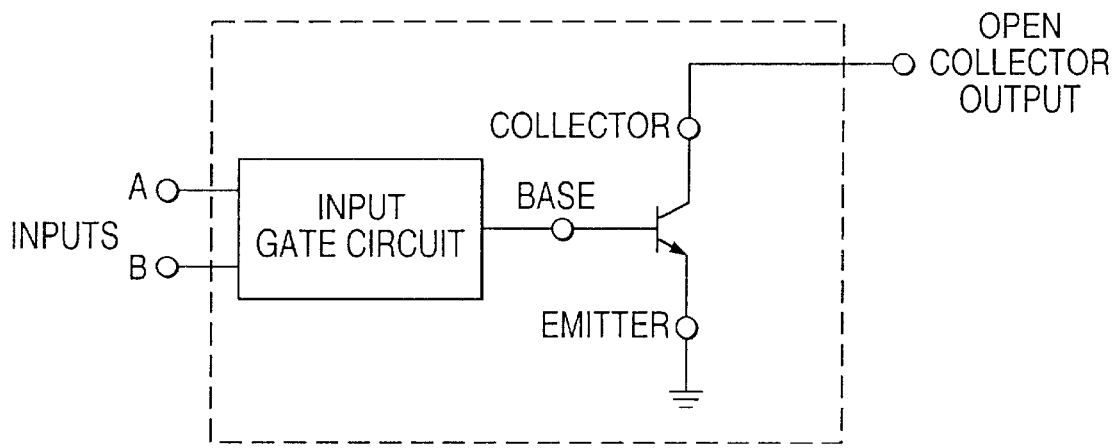
FIGS. 1A and 1B are example open collector circuit configurations.
Figure 1B:
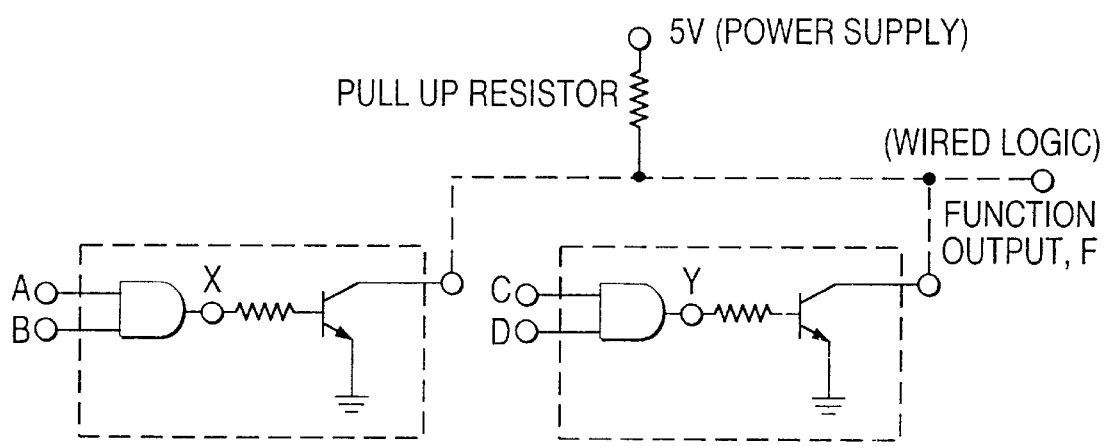
Figure 2:
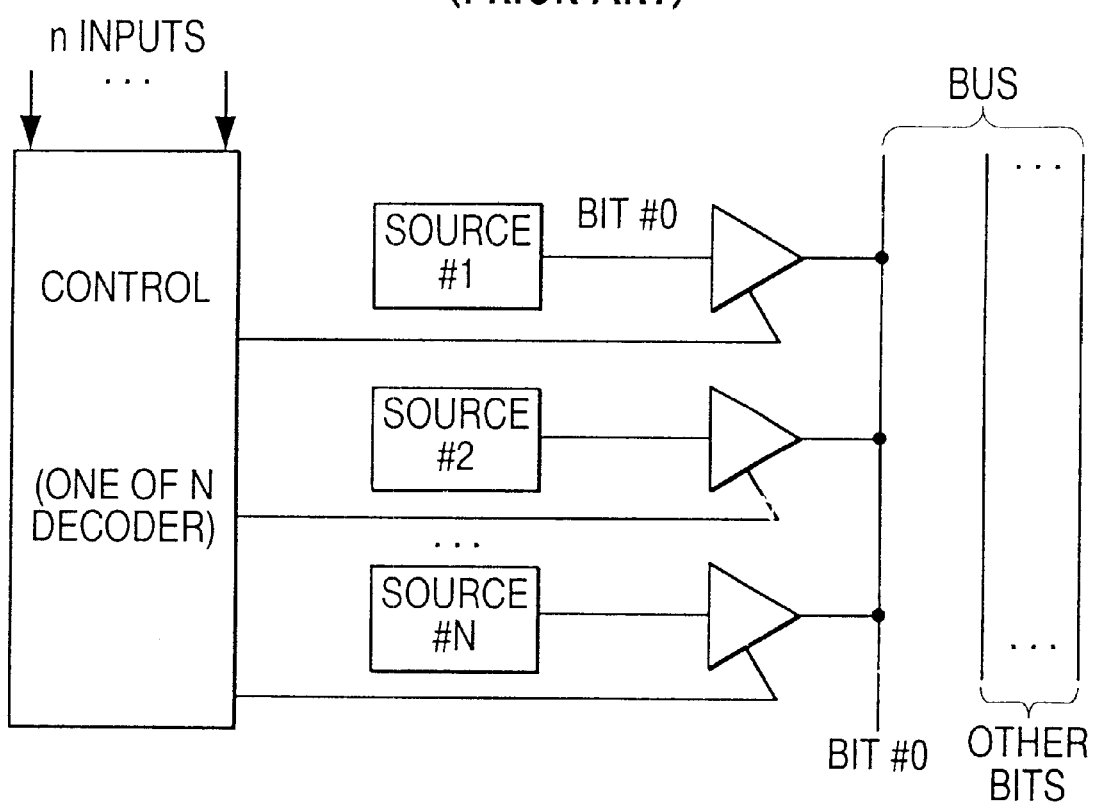
FIG. 2 is an example typical tri-state gate configuration.
Figure 3:
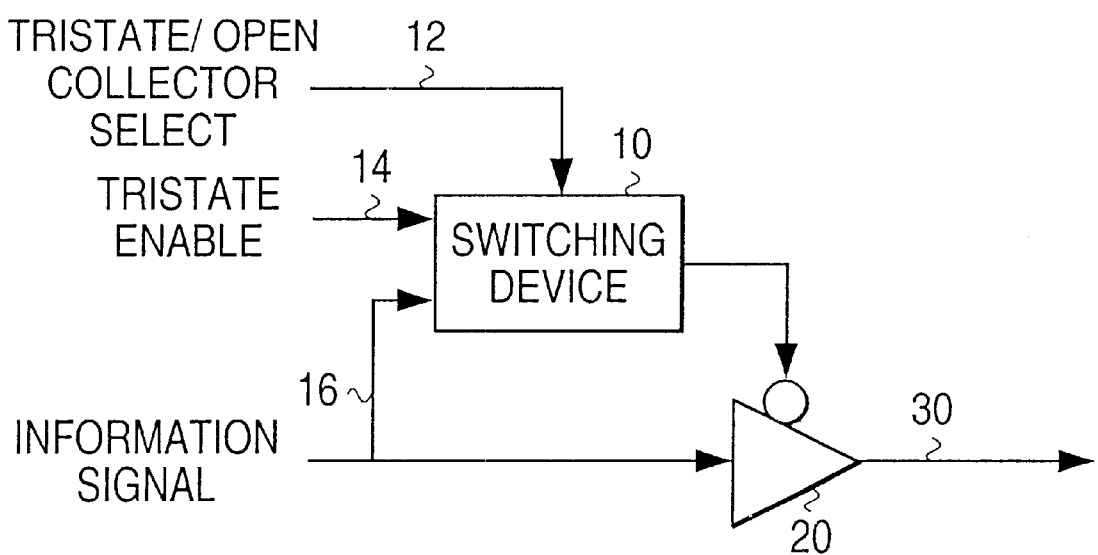
FIG. 3 is a schematic diagram of a circuit for a programmable output interface according to an example embodiment of the present invention.

FIG. 3 shows a schematic diagram of a circuit for a programmable output interface according to an example embodiment of the present invention. This circuit includes a switching device 10 and an output driver 20. Switching device 10 may receive two input signals, a tri-state enable signal 14 and an informational signal 16. Switching device 10 may also receive a control signal 12, tri-state/open collector select. The output of switching device 10 enables the output 30 of output driver 20. For example, when output driver 20 is enabled, information signal 16 is passed to output line 30 of output driver 20.

Tri-state/open collector select signal 12 may be used to select between a tri-state mode or an open collector mode. This signal controls switching device 10 to pass either tri-state enable signal 14 or information signal 16 to its output. Switching device 10 may be any type of switching device, for example, a switch, multiplexer, decoder, logic gate, transistor, etc. The output of switching device 10 may then be used to enable or disable output driver 20. If tri-state/open collector select signal 12 is set to select tri-state mode, the tri-state enable signal 14 is passed to the output of switching device 10 where it then controls output driver 20. Tri-state enable signal 14 is an active low signal in this example embodiment, meaning that a '0' logic level on tri-state enable signal 14 enables driver 20 and, therefore, passes information signal 16 to the output of output driver 20, i.e., signal line 30. When tri-state enable signal 14 is at a '1' logic level, output driver 20 is disabled, and the output signal line 30 "floats" and may be pulled to a high or a low level based on devices that signal line 30 are externally connected to. When tri-state enable signal 14 is at a '0' logic level, information signal 16 drives the output driver's output signal 30 to a high or a low level.

If tri-state/open collector select signal 12 is set to put the circuit in an open collector mode, information signal 16 is then passed through switching device 10 and is used to enable output driver 20. For example, in open collector mode, if information signal 16 is a '0' logic level, information signal 16 is passed through switching device 10 and enables output driver 20, therefore, passing the '0' level onto signal line 30. This effectively pulls signal line 30 down to a low level.

In contrast, if information signal line 16 is a '1' logic level, this logic '1' level is passed through switching device 10 which effectively turns off output driver 20, therefore, causing signal line 30 to float. However, in an open collector type system, a pull-up resistor will normally be connected to signal line 30, therefore, pulling this signal line up to a logic '1' level when output driver 20 is disabled, and no other external signals connected to this signal line are pulling the signal line low.

A circuit for a programmable output interface according to the present invention may be used in any type of electronic device. For example, this invention may be used in a standard electronic module design, as part of an interface to a system or subsystem, as part of an interface module that couples an electronic module to a specific interface, or as part of a microcircuit. The two control signals tri-state/open collector select 12 and tri-state enable 14, as well as the information signal 16, may come from internal to the component, subsystem, or device, or may be driven from one or more other components or devices external to the one that this circuit resides on. Information signal 16 may be any of many types of signals, for example, data, control signals, clock signals, etc.

Figure 4:
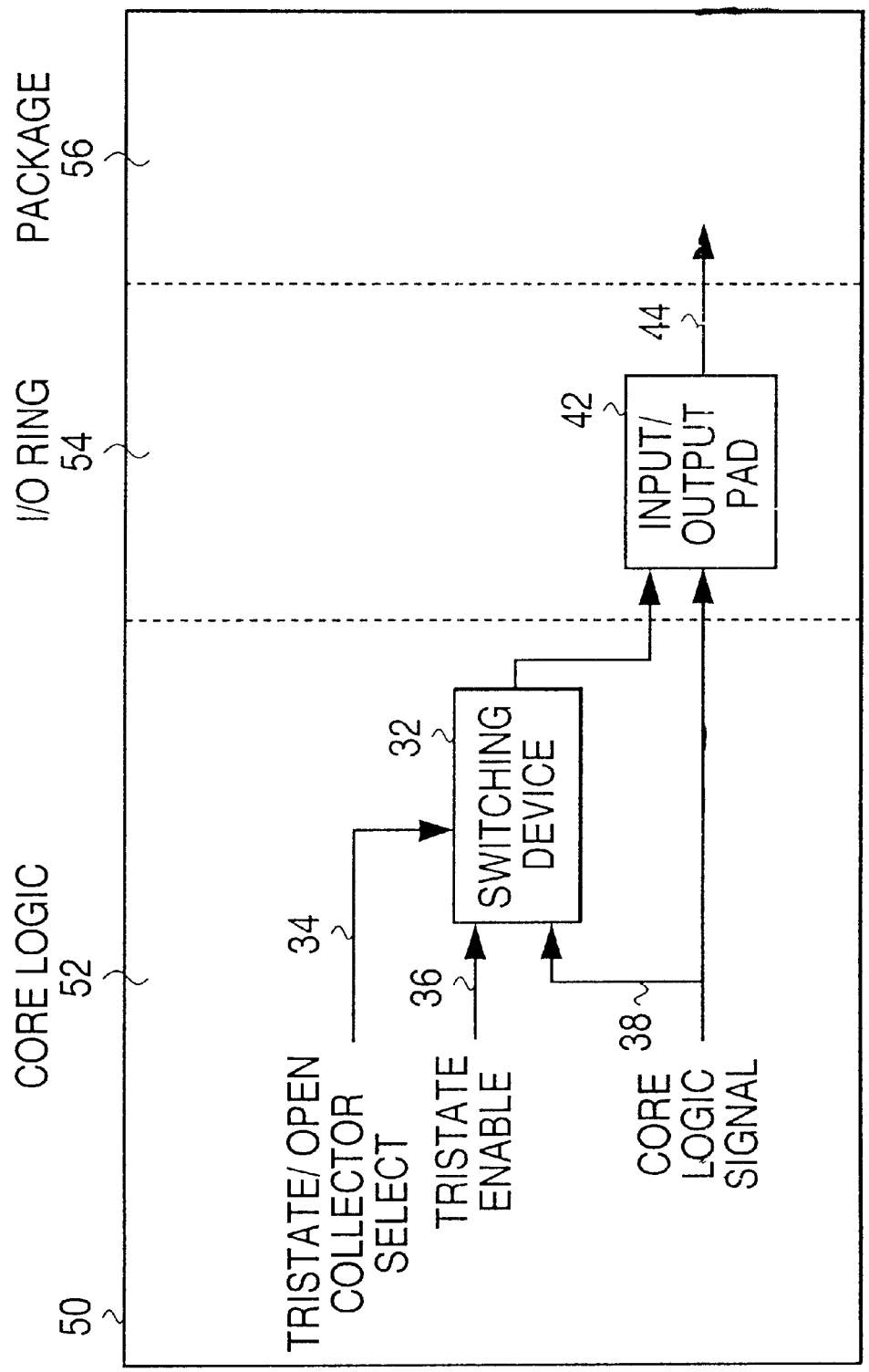
FIG. 4 is a diagram of a microcircuit with a programmable output interface according to an example embodiment of the present invention.

FIG. 4 shows a diagram of a microcircuit with a programmable output interface according to an example embodiment of the present invention. Microcircuit 50 may consist of three sections, core logic 52, and I/O ring 54, and a package 56. Core logic 52 and I/O ring 54 may reside on a die of the microcircuit 50. Core logic 52 represents the circuitry and the electronics that exist in microcircuit 50 that performs the desired functions of microcircuit 50. Switching device 32 may be part of core logic 52 and receive a tri-state/open collector select signal 34, tri-state enable signal 36, and a core logic signal 38, from other parts of core logic 52. Switching device 32 may then send an output signal to an input/output (I/O) pad 42 that resides on an I/O ring 54 of microcircuit 50. I/O pad 42 may also receive core logic signal 38. I/O pad 42 may be a standard, "off-the-shelf" I/O pad selectable from a library, database, etc. of components usable during the design of microcircuit 50.

Switching device 32 and its associated input signals may be used by core logic 52 to put I/O pad 42 into either a open collector output driver mode or a tri-state output driver mode. Therefore, output signal 44 from I/O pad 42 may be either an open collector output or a tri-state output. Output signal 44 may then be fed to package 56 and subsequently sent external to the package.

This embodiment of the present invention is advantageous in that "off the shelf" I/O pads may be used with the present invention to allow a programmable output interface. Core logic 52 simply need be designed to incorporate and supply the appropriate signals for the present invention. Tri-state/open collector select signal 34 and tri-state enable signal 36 may be driven by discrete logic gates, registers, memory devices, microcode, or other sources inside core logic 52. Core logic signal 38 may be a data signal, control signal, clock signal, etc.

Figure 5:
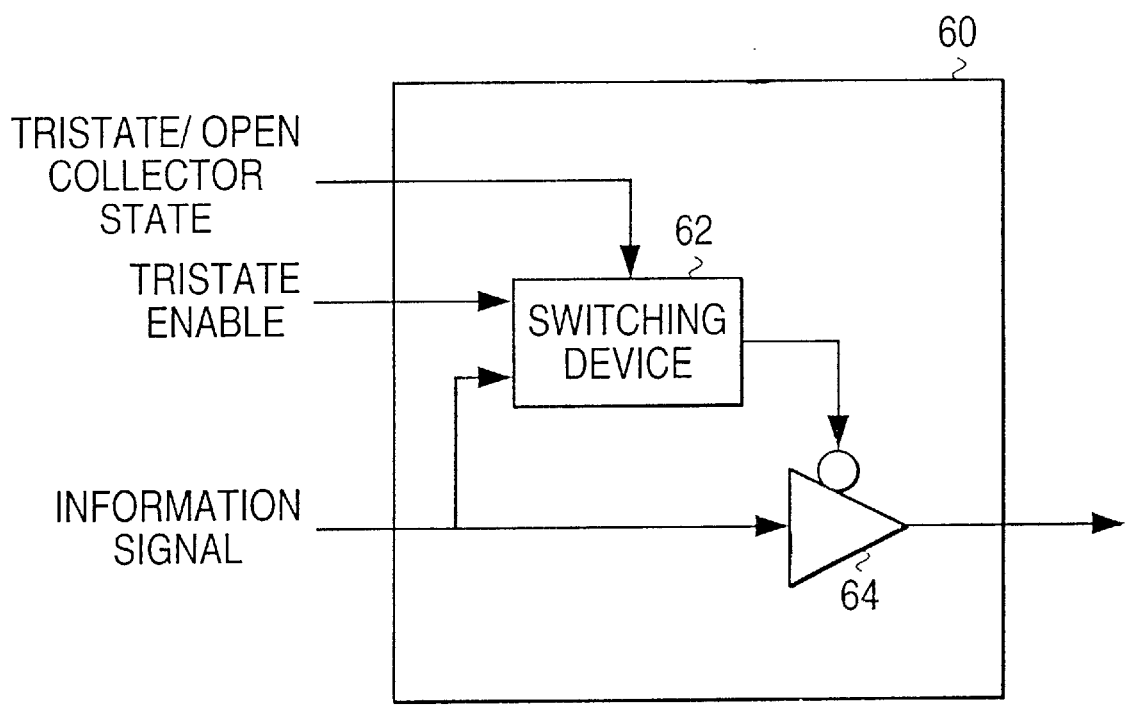
FIG. 5 is a diagram of an I/O pad with a programmable output interface according to an example embodiment of the present invention.

FIG. 5 shows a diagram of an I/O pad with a programmable output interface according to an example embodiment of the present invention. In this example embodiment, a circuit for a programmable output interface according to the present invention is incorporated into an I/O pad of a microcircuit. I/O pad 60 includes switching device 62 and output driver 64. Switching device 62 receives a tri-state/open collector select signal, tri-state enable signal, and information signal. Output driver 64 receives the information signal and is enabled by the output of switching device 62. In this example embodiment, the I/O pad may be a standard macro or component that is selectable from a library of components available to a microcircuit designer. Therefore, a microcircuit designer may simply design the core logic of the microcircuit, and depending on if a programmable output interface is desired, I/O pad 60 may be selected as an "off the shelf" component and used with the core logic of the microcircuit. This is advantageous in that a designer need not design the versatility into the designer's core logic, but may simply select the I/O pad and use it, as long as the associated control signals are designed in the core logic.

FIG. 6 shows a diagram of a microcircuit with a programmable output interface I/O pad according to an example embodiment of the present invention. In FIG. 6, microcircuit 70 includes a package 72 whereby a die 74 resides. Die 74 consists of a section of core logic 76 and an I/O ring 78, that may include one or more I/O pads 60.

Method and apparatus for a programmable output interface are advantageous in that time and money are saved. A designer need not design a custom circuit. Moreover, in one embodiment of the present invention, the use of standard I/O pads may be used when the present invention is applied to a microcircuit design. Having a programmable output interface allows the design of a single device or electronic circuit that can be adaptable depending on what other types of devices or circuits it is connected to.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A circuit for a programmable output interface comprising:
    a switching device, the switching device receiving an enable signal, a selection signal, and an information signal, the switching device passing one of the enable signal and the information signal to an output of the switching device based on the selection signal; and
    an output driver, an output of the output driver being enabled by the output of the switching device, the output driver receiving the information signal and passing the information to the output of the output driver if the output driver is enabled,
    wherein the selection signal is usable to convert the output driver output to one of a tri-state output and an open collector output, the enable signal usable to enable and disable the tri-state when the output driver output is a tri-state output.

2. The circuit according to claim 1, where the output driver is part of an Input/Output (I/O) pad of a microcircuit.

3. The circuit according to claim 1, wherein the switching device is a multiplexer.

4. The circuit according to claim 1, wherein the information signal comprises one of a data signal and a control signal.

5. A microchip Input/Output (I/O) pad comprising:
    a switching device, the switching device receiving an enable signal, a selection signal, and an information signal, the switching device passing one of the enable signal and the information signal to an output of the switching device based on the selection signal; and
    an output driver, an output of the output driver being enabled by the output of the switching device, the output driver receiving the information signal and passing the information to the output of the output driver if the output driver is enabled,
    wherein the selection signal is usable to convert the output driver output to one of a tri-state output and an open collector output, the enable signal usable to enable and disable the tri-state when the output driver output is a tri-state output.

6. The I/O pad according to claim 5, wherein the switching device receives the enable signal, the selection signal, and the information signal from core logic on the microchip.

7. The I/O pad according to claim 5, wherein the switching device receives the enable signal, the selection signal, and the information signal from one or more sources external to the microchip.

8. The I/O pad according to claim 5, wherein the switching device is a multiplexer.

9. The I/O pad according to claim 5, wherein the information signal comprises one of a data signal and a control signal.

10. The I/O pad according to claim 5, wherein the I/O pad is selectable from a library of devices and components for use by a microchip designer.

11. A microcircuit comprising:
    a switching device, the switching device receiving an enable signal, a selection signal, and an information signal, the switching device passing one of the enable signal and the information signal to an output of the switching device based on the selection signal; and
    an output driver, an output of the output driver being enabled by the output of the switching device, the output driver receiving the information signal and passing the information to the output of the output driver if the output driver is enabled,
    wherein the selection signal is usable to convert the output driver output to one of a tri-state output and an open collector output, the enable signal usable to enable and disable the tri-state when the output driver output is a tri-state output.

12. The microcircuit according to claim 11, wherein the switching device receives the enable signal, the selection signal, and the information signal from core logic on the microchip.

13. The microcircuit according to claim 11, wherein the switching device receives the enable signal, the selection signal, and the information signal from one or more sources external to the microchip.

14. The microcircuit according to claim 11, wherein the switching device is a multiplexer.

15. The microcircuit according to claim 11, wherein the information signal comprises one of a data signal and a control signal.

16. A method for programming an output interface comprising:

受receiving an enable signal, a selection signal, and an information signal at a switching device, the switching device passing one of the enable signal and the information signal to an output of the switching device based on the selection signal;

receiving the information signal at an output driver;

passing the information to the output of the output driver if the output driver is enabled, the output driver being enabled by the output of the switching device; and switching the output driver output to one of a tri-state output and an open collector output based on the selection signal.

17. The method according to claim 16, further comprising enabling and disabling the tri-state when the output driver output is a tri-state output based on the enable signal.

18. The method according to claim 16, wherein the information signal comprises one of a data signal and a control signal.

* * * * *